United States Patent [19]

Sasaki

[11] Patent Number: 5,378,925
[45] Date of Patent: Jan. 3, 1995

[54] ROUTING METHOD AND ARRANGEMENT FOR POWER LINES AND SIGNAL LINES IN A MICROELECTRONIC DEVICE

[75] Inventor: Minoru Sasaki, Suwa, Japan

[73] Assignee: Seiko Epson Corporation, Tokyo, Japan

[21] Appl. No.: 842,352

[22] PCT Filed: Jul. 19, 1991

[86] PCT No.: PCT/JP91/00970

§ 371 Date: May 18, 1992

§ 102(e) Date: May 18, 1992

[87] PCT Pub. No.: WO92/02043

PCT Pub. Date: Feb. 6, 1992

[30] Foreign Application Priority Data

Jul. 23, 1990 [JP] Japan .................................. 2-194237

[51] Int. Cl.[6] ..................... H01L 23/48; H01L 29/44; H01L 29/52; H01L 29/60
[52] U.S. Cl. .................................. 257/691; 257/207; 257/208
[58] Field of Search ............... 257/691, 692, 698, 207, 257/208, 209, 210, 211, 700

[56] References Cited

U.S. PATENT DOCUMENTS

| | | | |
|---|---|---|---|
| 4,748,494 | 5/1988 | Yamada et al. | 257/691 |
| 4,914,503 | 4/1990 | Shirato et al. | 257/691 |
| 4,989,062 | 1/1991 | Takahashi et al. | 257/207 |
| 5,119,169 | 6/1992 | Kozono et al. | 257/691 |

FOREIGN PATENT DOCUMENTS 0041844  12/1981  European Pat. Off. .

*Primary Examiner*—Andrew J. James
*Assistant Examiner*—S. V. Clark
*Attorney, Agent, or Firm*—Eric B. Janofsky

[57] ABSTRACT

In a semiconductor integrated circuit device such as a memory chip, the number of wirings is increasing as the memory capacity and the like increase. In improving the reliability and obtaining high access speed of a common bus in which these wirings are arranged, wirings in a second layer and via holes at jumpers used for interference portions of signal wirings and power supply wirings in a congested region of a common bus have become an issue. Accordingly, in the present invention, it is made possible to form wirings in the second layer having wide width and a plurality of via holes per one connecting point, thus realizing a semiconductor integrated circuit which has high reliability and high access speed by arranging a mother power supply wiring branched to the common bus line along the vicinity of processing circuits of signal wirings arranged in the common bus.

6 Claims, 5 Drawing Sheets

ROUTING METHOD AND ARRANGEMENT FOR POWER LINES AND SIGNAL LINES IN A MICROELECTRONIC DEVICE

BACKGROUND OF THE INVENTION

1. Field of the Invention

This invention relates generally to a layout arrangement of a microelectronic device in which a plurality of interconnect lines, such as signal wirings for driving a decoder circuit in a memory chip, are arranged in parallel with power supply lines, and more particularly relates to a semiconductor integrated circuit device using two or more layers of interconnect lines.

2. Related Art

FIG. 4 shows a layout of a conventional memory chip. Memory chip 1 is a read-only memory (ROM), and is composed of four memory cell blocks 2a to 2d. Between memory cell blocks 2a and 2b are arranged a row decoder circuit 3a including a decoder and a buffer for driving a word line of memory cell block 2a and a row decoder circuit 3b of memory cell block 2b so as to confront each other. Between memory cell blocks 2c and 2d are also arranged respective row decoder circuits 3c and 3d so as to confront each other.

In an upper part of FIG. 4, column decoder circuits 5a to 5d and sense amplifier circuits 6a to 6d for processing signals of bit lines of respective memory cell blocks 2a to 2d are arranged for memory cell blocks 2a to 2d, respectively. In a lower part of FIG. 4, peripheral circuits 4a and 4b including predecoder circuits in which signals for driving the row decoders and so forth are arranged for memory cell blocks 2a to 2d as shown. Peripheral circuit 4a is a circuit common to decoder circuits 3a and 3b, and arranged under memory cell blocks 2a and 2b. Peripheral circuit 4b is a circuit common to decoder circuits 3c and 3d, and arranged under memory cell blocks 2c and 2d.

In the arrangement of power supply wirings for supplying power to these circuits, a pad 7 supplied with Vss (0V) is formed on the outer circumferential side of sense amplifier circuits 6a and 6b. A main wiring 11 is arranged around chip 1 from pad 7, and Vss is applied to respective circuits by branch wirings 12 which are arranged in parallel with respective circuits so as to run towards the center of chip 1 from mother wiring 11. In memory cell blocks 2a to 2d and row decoder circuits 3a to 3d, Vss is supplied to respective cells 2a to 2d and circuits 3a to 3d through branch wirings 13 branched further from a part 12a of branch wirings 12.

A pad 8 supplied with Vdd (5V) is formed on the outer circumferential side of predecoder circuits 4a and 4b. A main wiring 21 is formed from pad 8 in-between memory cell blocks 2b and 2c, and Vdd is supplied to respective circuits through branch wirings 22 arranged in parallel with respective circuits from mother wiring 21 toward the circumference of chip 1. In row decoder circuits 3a to 3d, Vdd is supplied to decoder circuits 3a to 3d through branch wirings 23 branched further from a part 22a of branch wiring 22.

As described above, the power supply lines, Vss and Vdd, are arranged in separated positions so that Vss is supplied from the outer circumference to the center of chip 1 and Vdd is supplied from the center to the outer circumference. By adopting such a layout that wiring channels of Vss and Vdd are separated, wirings of Vss and Vdd avoid intersecting each other.

In chip 1 having such a layout, a region II where signal wirings which connect peripheral circuits 4a and 4b and row decoders 3a to 3d with one another gather together is a region where signal wirings and power supply wirings intersect one another, and is also one of wiring channels having the highest density in chip 1. Thus, the layout of region II is one of the most important factors for determining access speed and chip size of memory chip 1.

FIG. 5 shows a layout of region II in a conventional device. In a common bus region 30 between row decoder circuits 3a and 3b, n lines of signal wirings 31.1 to 31.n from peripheral circuit 4a to decoder circuits 3a and 3b are arranged in parallel with one another while being placed between power supply wirings 23a and 23b. Wirings 31.1 to 31.n are connected with respective jumpers 42.1 to 42.n of n pieces of function cells 41.1 to 41.n of peripheral circuit 4a. The wirings for signals outputted from these jumpers 42.1 to 42.n generally intersect with power supply wiring 12 of peripheral circuit 4a which is laid out along both ends of peripheral circuit 4a. As a result, jumpers 42.1 to 42.n are formed to polycrystalline silicon (poly-Si) across an insulating layer in a lower layer of power supply wiring 12. Further, logic circuits being arranged inside, respective function cells 41.1 to 41.n are arranged in a region having a width wider than the width of common bus 30 where respective signal wirings 31.1 to 31.n are arranged collectively. As a result, respective signal wirings 31.1 to 31.n, connected with jumpers 42.1 to 42.n, arranged in respective function cells 41.1 to 41.n are assembled toward common bus 30 using the portion between row decoder circuits 3a and 3b and peripheral circuit 4a as an assembling region 50.

Signal wirings 31.1 to 31.n, thus assembled, intersect with power supply wiring 22a of row decoders 3a and 3b in a congested region 51 at an inlet portion to common bus 30. Therefore, wiring is made using wirings 32.1 to 32.n in a second layer of highly resistive (relative to metal interconnect) poly-Si formed with an insulating layer put therebetween under power supply wiring 22a in inlet portion 51 of the respective signal wirings 31.1 to 31.n. Wirings 32.1 to 32.n in the second layer and respective signal wirings 31.1 to 31.n are connected with one another through two through holes, a through hole 33 on peripheral circuit 4a side and a via hole 34 on common bus side for every wiring.

In a chip having the above-described layout, some problems related to region II result when memory capacity is increased and high access speed is required. These problems develop when the memory region area is increased along with the memory capacity and the number of signal wiring lines to the decoder, but the size of the chip is limited due to packaging constraints and the like, and it is difficult to widen the width of the common bus. Accordingly, the width of signal wirings is narrowed, and similarly, the wiring width of the second layer of poly-Si is also reduced. Since poly-Si is a high resistance layer, the resistance value of the wiring is increased sharply due to the reduction of the wiring width, and thus resulting in reduction on the access speed to the decoder. Therefore, the access speed to the memory is reduced.

The quantity of through holes for connecting the wirings in the second layer with signal wirings has to be reduced at the same time, and the resistance of this portion is also increased. Therefore, the access speed is reduced further.

Moreover, it is required to form a plurality of through holes in accordance with the number of lines of signal wirings in a limited wiring region as the number of signal wirings is increased. In manufacturing such a region, it is impossible to form all the through holes in perfect shapes, and such defects as via holes having defective connection or high connecting resistance, and via holes short-circuited with adjacent wirings are generated sometimes. Since this percent defective has a tendency to increase as the spacing among via holes gets narrower, the reliability of the memory chip is lowered and the memory of the defective portion cannot be used, thus resulting in reduction in yield. Several means have been proposed as means for solving above-described problems. For example, rather than use poly-Si as an interconnect material in the highly congested areas of interconnection, low resistance metal can be used such as is available in a double or triple metal semiconductor process. However, extra processing steps are required to produce this additional layer of metal interconnect. More particularly, an insulating layer must be formed between two metal layers, and contact holes, or through holes, through the insulating layer must be formed. Additionally, contact resistance which occurs when making connections from one metal layer to the other, must be overcome.

Another proposal is to alter the layout such that power supply wirings do not intersect with signal wirings. In order to avoid interference with the signal wirings, however, it is required to arrange power supply wirings from both sides toward the common bus in a direction perpendicular to the common bus. Namely, the same power supply wiring is to be arranged both at the center and the circumference of the semiconductor device. Such a layout is not applicable to a semiconductor device in which a layout with the power supply wirings separated is adopted in order to avoid mutual intersection of power supply wirings as described previously. Because, in case the layout is adopted, two types of power supplies are arranged at the same time around the semiconductor, and mutual interference between power supply wirings is produced when power is supplied to respective circuits.

Although it is possible to avoid interference by forming the power supply wirings in two layers, the problem of manufacturing process still remains similarly to the previous proposal in which signal wirings are formed in two layers in the upper part. Furthermore, since the channels of feeding lines of the power supply to decoder circuits associated with respective memory cell blocks are different for every power supply wiring, it becomes difficult to set the potential applied to respective circuits to the same level and also to make the signal level identical.

SUMMARY OF THE INVENTION

It is an object of the present invention to realize a layout which is able to reduce wiring resistance without expanding the region required for wirings with respect to a region where the signal wirings are assembled.

It is a further object to improve of the reliability of wiring interconnections.

It is a still further object to improve access speed.

Briefly, problems as described above are solved in the present invention by arranging the mother power supply wiring of the common bus is branched along the vicinity of peripheral circuits such as for signal processing provided around the memory cell blocks. Namely, a semiconductor integrated circuit device having at least a signal processing circuit in which a plurality of connecting regions of signal wirings are arranged discretely and a wiring laying region where signal wirings connected with the signal processing circuit are assembled so as to be in parallel among a plurality of power supply wirings according to the present invention is characterized in that the main power supply wiring from which power supply wirings are branched is arranged along the vicinity of a connecting region of the signal processing circuit.

It becomes possible to avoid interference between the main power supply wiring and respective signal wirings in a congested region corresponding to an inlet portion of the wiring laying region by arranging the main power supply wiring in the vicinity of the connecting region of the signal processing circuit as described above. Further, since the main power supply wiring is arranged along the vicinity of the connecting region of the signal processing circuit, it becomes possible to process interference between the main power supply wiring and signal wirings in the vicinity of that region. The connecting regions of the signal processing circuit are disposed discretely from a space required for logic circuits in the processing circuit. Thus, the spacing among respective signal wirings is secured sufficiently in the vicinity of this region for the signal wirings connected in the connecting region. Accordingly, it is possible to secure wide width of the signal wirings in the second layer required for processing intersection among respective signal wirings and the mother power supply wiring by arranging the mother power supply wiring in the vicinity of this region. As a result, signal wirings in the second layer having low resistance may be realized even in a semiconductor device having a high wiring density of a common bus which corresponds to a wiring laying region of a memory chip and the like. In addition, it is possible to easily arrange via holes in a quantity sufficient for connecting signal wirings in the second layer and respective signal wirings in the same wiring layer as the mother power supply wiring with one another.

Furthermore, the connecting region of the signal processing circuit is connected with signal wirings using the wiring layer in the second layer in many cases in order to avoid interference with power supply wiring for the signal processing circuit. Therefore, by extending the wiring in the second layer to the portion interfering with the main power supply wiring, it is possible to reduce the number of connecting points of the signal wirings, and also to aim at reduction of connecting resistance and prevention of deterioration of reliability caused by nonconformity of the connecting points.

In the above-described semiconductor integrated circuit device composed of a plurality of memory cell blocks, the main power supply wiring may be arranged in the vicinity of a plurality of peripheral circuits which are signal processing circuits arranged around the memory cell region so as to process intersection of the signal wirings connecting the decoder circuits arranged among memory cell blocks with peripheral circuits through the common bus and the mother power supply wiring. Further, power supply wirings branched from the main power supply wiring are assembled in the common bus in parallel with these signal wirings, and thus, will never intersect again at an inlet portion of the common bus and the like. Further, the power supply to the decoder circuits arranged on both sides of the common bus may be applied through one main power supply wiring similarly as before. Therefore, it is not required to give consideration to potential variation and interference with other power supply wirings.

Since it is possible to secure sufficient distance for the spacings in respective connecting regions of peripheral circuits and signal wirings by adopting such a layout, it is possible to form signal wirings in the second layer having a large area showing low resistance. Further, since it is also possible to secure a large area at the connecting portion of signal wirings in the second layer and the first signal wiring in the same layer as the mother power supply wiring, it is possible to connect the first and second signal wirings with each other using a plurality of via holes. Thus, it is possible to aim at reduction of the resistance at the connecting portion. Moreover, nonconformity of via holes which may be produced in the manufacturing process can be solved by forming a plurality of via holes in a connecting portion at one location. As a result, in a semiconductor integrated circuit device according to the present invention, it is possible to prevent reduction in the access speed with the increase of the resistance of the signal wirings and also to prevent deterioration of reliability in connection with via holes at the same time.

Furthermore, since the power supply wirings to peripheral circuits are arranged generally on the connecting region of peripheral circuits, the above-described mother power supply wiring is to be arranged in parallel with the power supply wiring to the peripheral circuits. With such an arrangement, it is possible to extend the connecting region formed in the wiring layer of the second layer to the intersecting portion with the main power supply wiring in order to avoid interference with the power supply wiring to the peripheral circuits. In this case, it is possible to reduce two wirings in the second layer which have been heretofore required for avoiding interference with the power supply wirings to the peripheral circuits and for avoiding interference with the mother power supply wiring to one wiring in the second layer which is common to the power supply wiring to the peripheral circuits and the mother power supply wiring. Accordingly, it is possible to aim at reduction of the connecting resistance with the wirings in the second layer, and at the same time, to reduce nonconformity in point of manufacturing occurring frequently at the connecting portion by reducing the number of jumpers, thereby to aim at improvement of reliability of the device.

Furthermore, in a device in which the power supply wiring to the peripheral circuits and the main power supply wiring are in parallel with each other and power consumption in the peripheral circuits is stabilized, it is also possible to form the power supply wirings to the peripheral circuits and the main power supply wiring into a common wiring. In case such a layout is adopted, the wiring in the second layer may be made shorter. Hence, further reduction of the wiring resistance may be expected in addition to above-described effects.

Further, in a general semiconductor integrated circuit device, the common bus and the main power supply wiring meet at right angles with each other in many cases from the viewpoint of interference among power supply wirings and the layout of function cells. This is a matter of course in a device having such a layout, but, in a semiconductor device in which the power supply wirings are branched to the common bus from the main power supply wiring, the present invention is also applicable even in case the common bus and the main power supply wiring do not meet at right angles with each other.

Aluminum wirings having low resistance may be used for the wirings in the first layer which is the same as the main power supply wiring as above-described signal wirings. Further, both aluminum wirings and poly-Si wirings may be used for the wirings in the second layer formed through an insulating layer in the upper part or the lower part of this first layer. The aluminum wirings are of low resistance, but required to be added to the upper layer of the first layer in general. On the contrary, the polycrystalline wirings have an advantage that they may be formed simultaneously with surface working of the semiconductor device in spite of high resistance. Further, since it is possible to secure sufficient width of the wirings of the second layer in the present invention, it is possible to form signal wirings of the second layer having low resistance by using poly-Si wirings.

Other objects, advantages and attainments together with a fuller understanding of the invention will become apparent and appreciated by referring to the following description and claims taken in conjunction with the accompanying drawings.

DETAILED DESCRIPTION OF THE INVENTION

Embodiment 1

Figure 1:
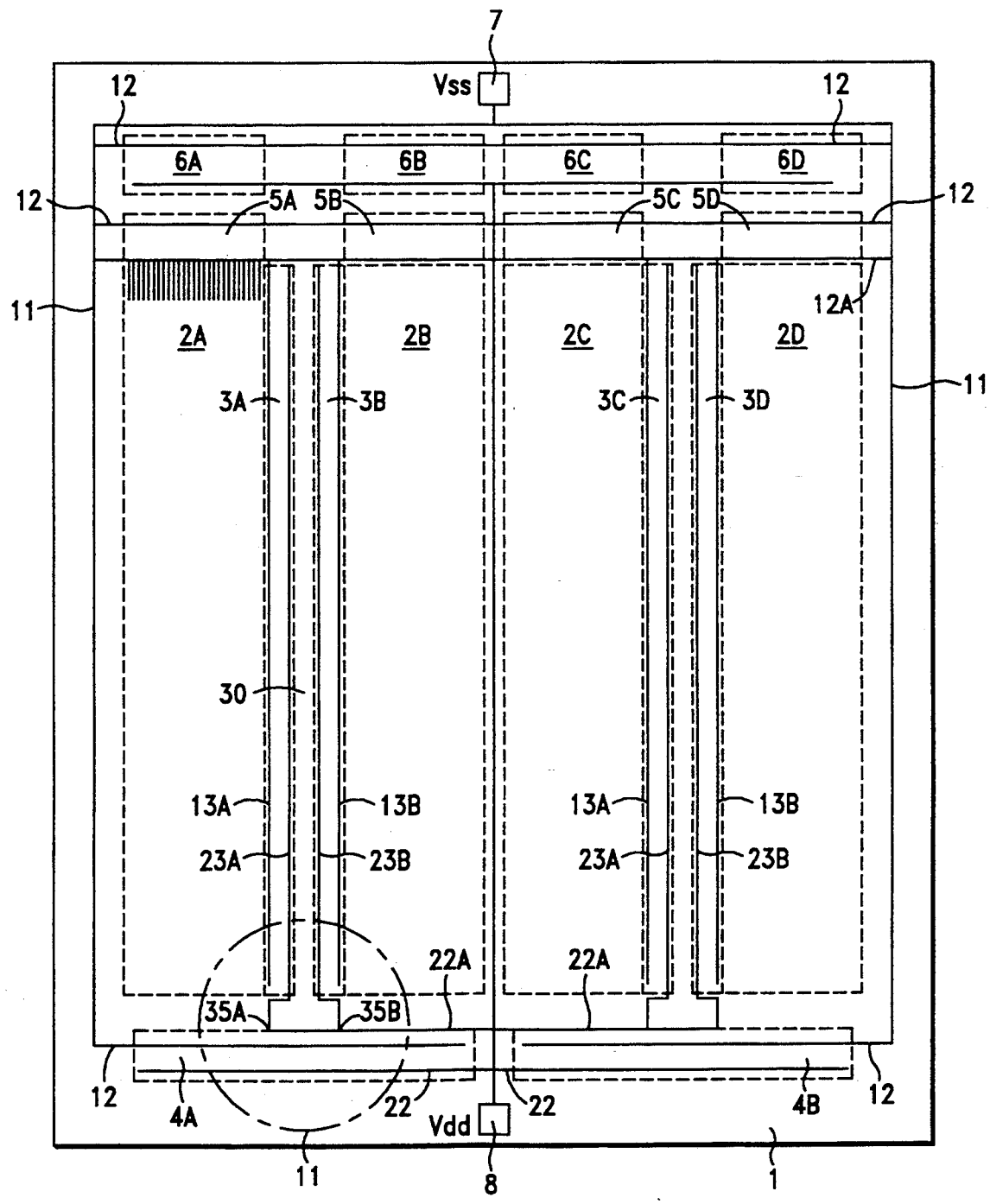
FIG. 1 is a layout diagram for explaining power supply wiring arrangement of a semiconductor integrated circuit device according to the embodiment 1 of the present invention.

FIG. 1 shows a layout of a semiconductor integrated circuit device according to embodiment 1 of the present invention. The shown semiconductor device is a read-only memory chip (ROM) similar to the conventional device described above, and is composed of four memory cell blocks 2a to 2d. Row decoder circuits 3a and 3b, and 3c and 3d are arranged between memory cell blocks 2a and 2b and between 2c and 2d, respectively, so as to confront each other. Further, in the lower part in the figure of column decoder circuits 5a to 5d, sense amplifier circuits 6a to 6d and memory cell blocks 2a to 2d which are located on the opposite side of above-described circuits, peripheral circuits 4a and 4b including predecoder circuits in which signals for driving row decoders are generated are arranged. The arrangement of respective cells and circuits is similar to that of a conventional device described above. Hence, the same reference numerals are assigned to them.

In the layout of the power supply wirings, Vss and Vdd are arranged so that they do not intersect each other as in a conventional device, and a layout in which wiring channels of Vss and Vdd are separated from each other is adopted. More particularly, Vss is first supplied to respective circuits through branch wirings 12 so as to run toward the center of a chip 1 through a mother wiring 11 arranged around chip 1 from a pad 7. Further, Vss is also supplied to memory cell blocks 2a to 2d and row decoder circuits 3a to 3d through branch wirings 13, branched further from a part 12a of branch wirings 12. Further, Vdd is supplied to respective circuits with branch wirings 22 from a pad 8 through a mother wiring 21 arranged at the center of memory chip 1. In row decoder circuits 3a to 3d, Vdd is supplied to decoder circuits 3a to 3d through further branched branch wirings 23 from a part 22a of branch wirings 22.

The point to be noticed in the present embodiment is the arrangement of power supply wiring 22a in a region II where signal wirings for connecting peripheral circuits 4a and 4b which are one of wiring channels having the highest density in chip 1 with row decoders 3a to 3d are assembled. In a conventional semiconductor device described above, power supply wirings 22a which have been arranged just under decoder circuits 3a and 3b are arranged just above peripheral circuit 4a. Further, branch points 35a and 35b of wirings 23a and 23b which branch from power supply wiring 22a are arranged outside signal wirings 31.1 to 31.n which are assembled in a common bus 30 from peripheral circuit 4a. Further, these two lines of power supply wirings 23a and 23b are assembled in common bus 30 so as to form a convex form (nearly inverted Y form) along the outer circumference of signal wirings 31.1 to 31.n.

Figure 2:
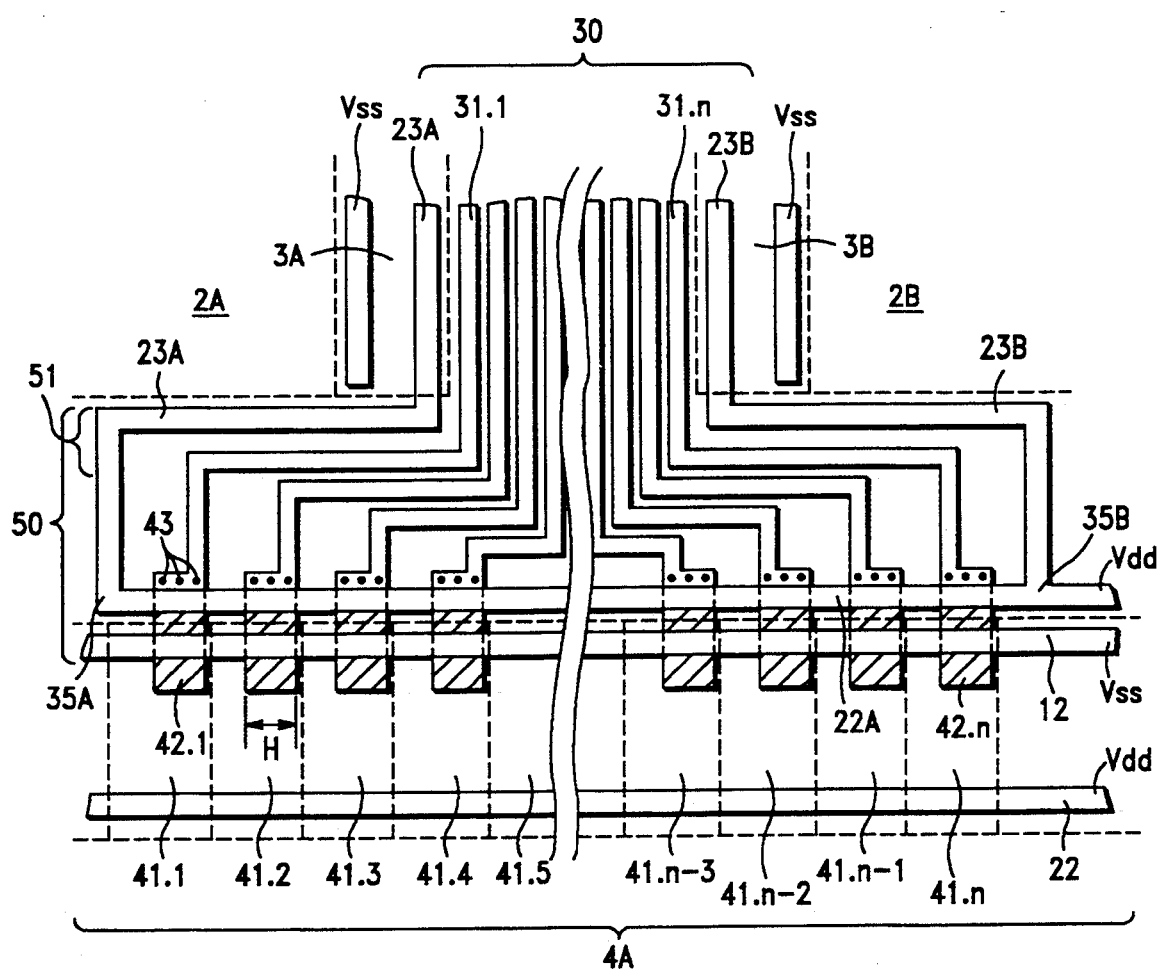
FIG. 2 is a layout diagram showing a portion where signal wirings are assembled in a common bus according to the embodiment 1.

FIG. 2 shows details of region II where signal wirings 31.1 to 31.n are assembled in common bus 30. The layout of the present region II is almost similar to that of above-described conventional device, and n lines of signal wirings 31.1 to 31.n for connecting peripheral circuit 4a and decoder circuits 3a and 3b with one another are arranged in parallel being put between power supply wirings 23a and 23b in common bus 30 between row decoder circuits 3a and 3b. These wirings 31.1 to 31.n are connected with jumpers 42.1 to 42.n of respective function cells 41.1 to 41.n of peripheral circuit 4a.

Jumpers 42.1 to 42.n are formed of poly-Si. Mother wiring 22a of power supply wirings 23a and 23b of row decoders 3a and 3b is arranged in parallel with power supply wiring 12 of peripheral circuit 4a above jumpers 42.1 to 42.n. Further, power supply wirings 23a and 23b are branched from mother wiring 22a located outside cells 41.1 and 41.n at both ends of function cell 41 at branch points 35a and 35b. Branched power supply wirings 23a and 23b are arranged so as to meet at right angles with mother wiring 22a along the outside of signal wirings 31.1 and 31.n at both ends which are assembled in common bus 30, and are bent thereafter toward common bus 30 at the lower ends of memory cell blocks 2a and 2b which are in parallel with congested region 51 which is an inlet portion of common bus 30. Power supply wirings 23a and 23b are bent again at portions corresponding to both ends of common bus 30 so as to meet at right angles with main wiring 22a, and are arranged so as to run along row decoders 3a and 3b.

In the semiconductor device of the present embodiment, a layout as described above is adopted, and main wiring 22a is arranged above jumpers 42.1 to 42.n. Thus, interference between signal wirings 31.1 to 31.n and mother wiring 22a is overcome by jumpers 42.1 to 42.n. Accordingly, there is no interference with main wiring 22a in congested region 51 at the inlet portion of common bus 30 as in a conventional semiconductor device. Signal wirings in the second layer of poly-Si which have been concentrated at narrow inlet portion 51 are omitted, and all signal wirings 31.1 to 31.n are wired with aluminum wirings having low resistance. As a result, the resistance of signal wirings 31.1 to 31.n may be reduced. Furthermore, since vias needed for connection to the second layer can also be eliminated, reduction of contact resistance can be achieved. Therefore, the total resistance of wirings 31.1 to 31.n is reduced resulting in improvement of the signal transmitting speed.

Further, since via holes concentrated in a conventional small inlet region have been removed, it is possible to prevent nonconformity such as short-circuit and disconnection caused by improper manufacturing of through holes, thereby to realize a highly reliable memory cell block. Further, since it is not required to give consideration to manufacturing limits of through holes in designing common bus 30, it becomes possible to increase the quantity of signal wirings arranged in bus line 30 and to aim at improvement of production yield.

With respect to the spacing between jumpers 42.1 to 42.n sufficient spacing is secured as compared with the width of signal wirings 31.1 to 31.n by the arrangement of logic circuits included in function cells 41.1 to 41.n. Accordingly, jumpers 42.1 to 42.n are of poly-Si having high resistance, but the width H of each of jumpers 42.1 to 42.n is such that the resistance value thereof becomes sufficiently small. Further, it is possible to form a plurality of through holes 43 extending over width H. Thus, a plurality of through holes are formed for one connecting portion. Even if one through holes is not connected due to a manufacturing fault, it is possible to maintain connection by means of the other through holes, thus making it possible to form a highly reliable connecting portion. Since sufficient spacing among respective jumpers is secured, the risk of yield-reducing short-circuits is reduced.

In the present embodiment, Vss power supply wiring 12 to peripheral circuit 4a and Vdd mother wiring 22a to the decoder circuit are arranged closely to each other in parallel. As a result, intersections of these two lines of wirings 12 and 22a with signal wirings 31.1 to 31.n are handled only by jumpers 42.1 to 42.n, and the number of connecting points with the wirings in the second layer formed under the power supply wiring is reduced as compared with a conventional layout.

As described above, although it looks that the layout of the power supply wirings has become complicated at first sight in the present embodiment, the layout has been simplified in terms of reducing jumpers, resulting in improvement of device reliability and reduction in access time.

Embodiment 2

Figure 3:
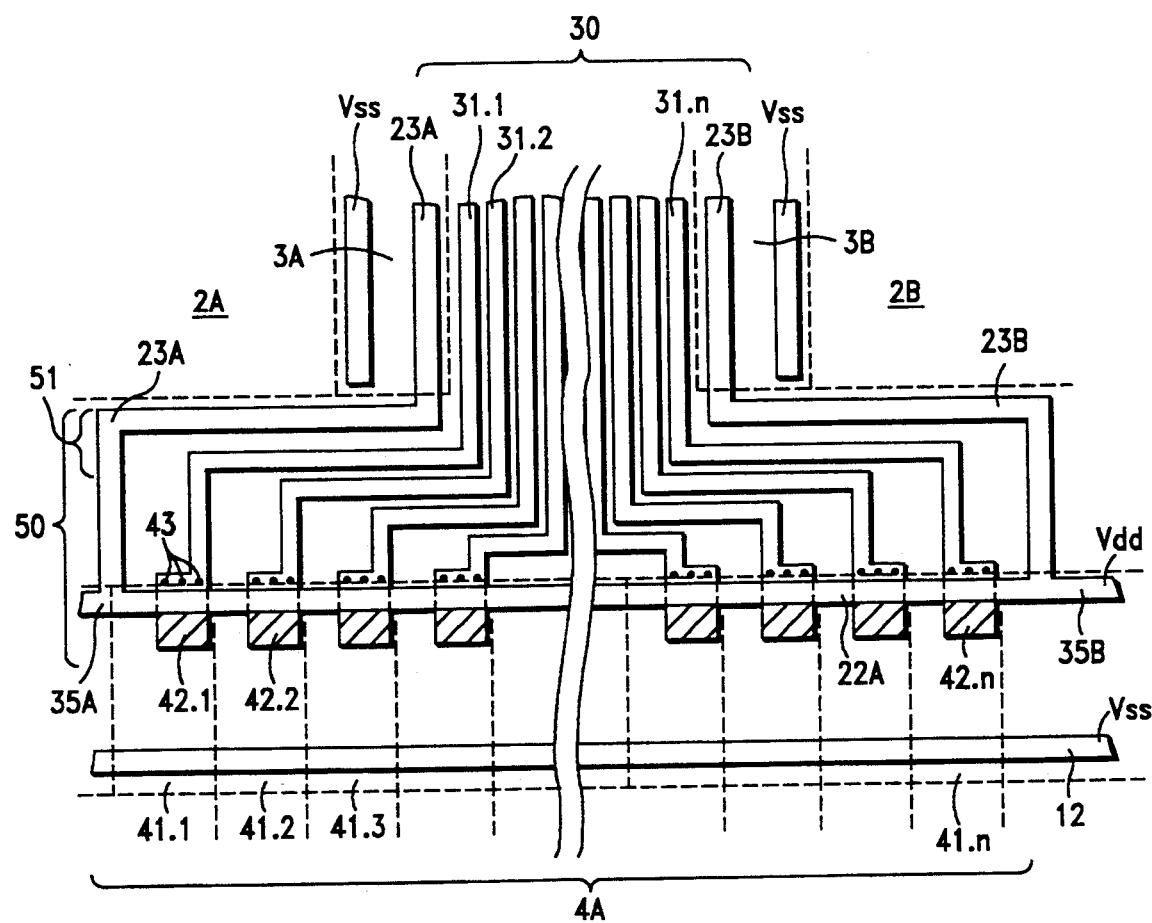
FIG. 3 is a layout diagram showing a portion where signal wirings are assembled in a common bus according to the embodiment 2 of the present invention.
Figure 4:
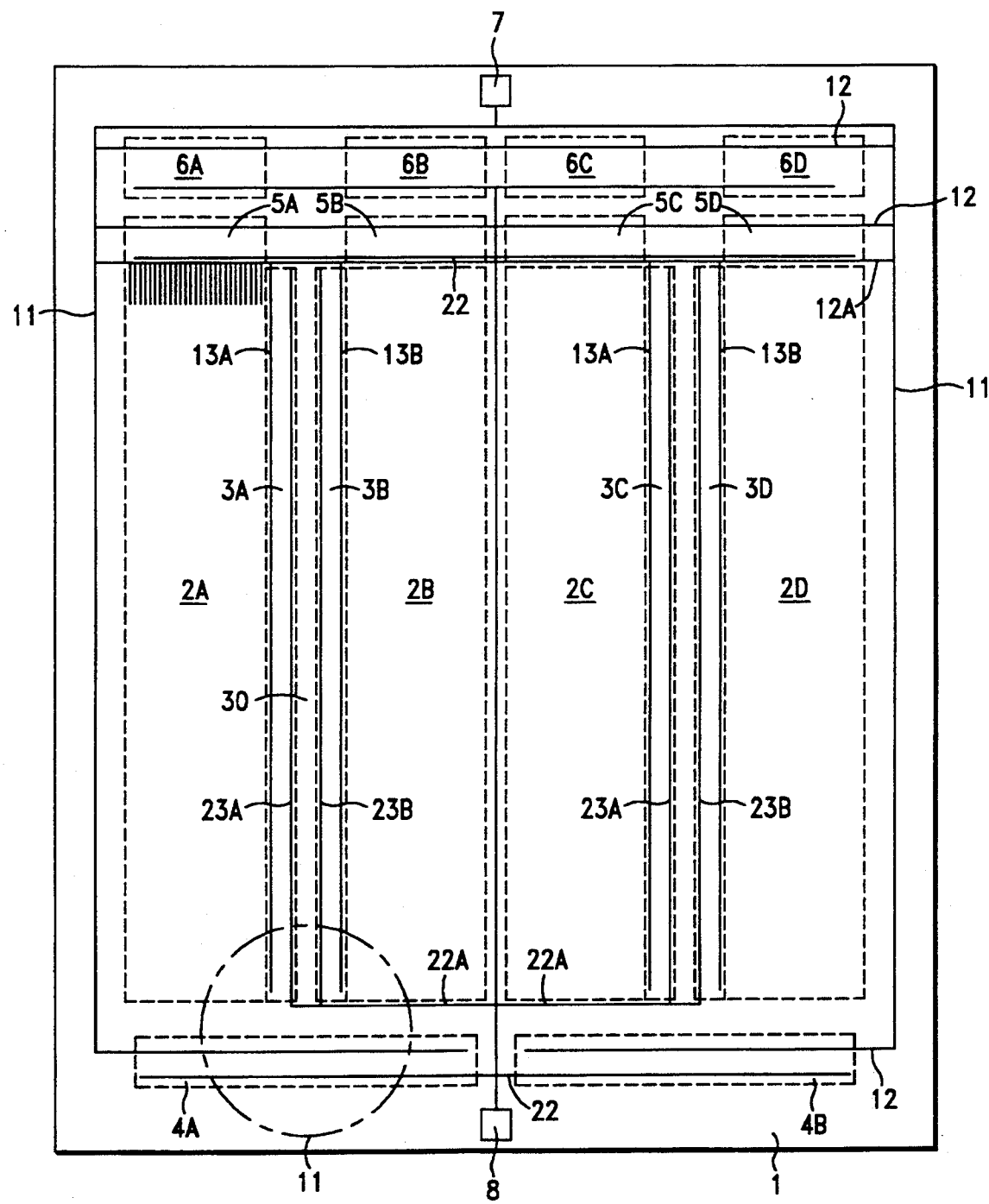
FIG. 4 is a layout diagram for explaining power supply wiring arrangement of a conventional semiconductor integrated circuit device.
Figure 5:
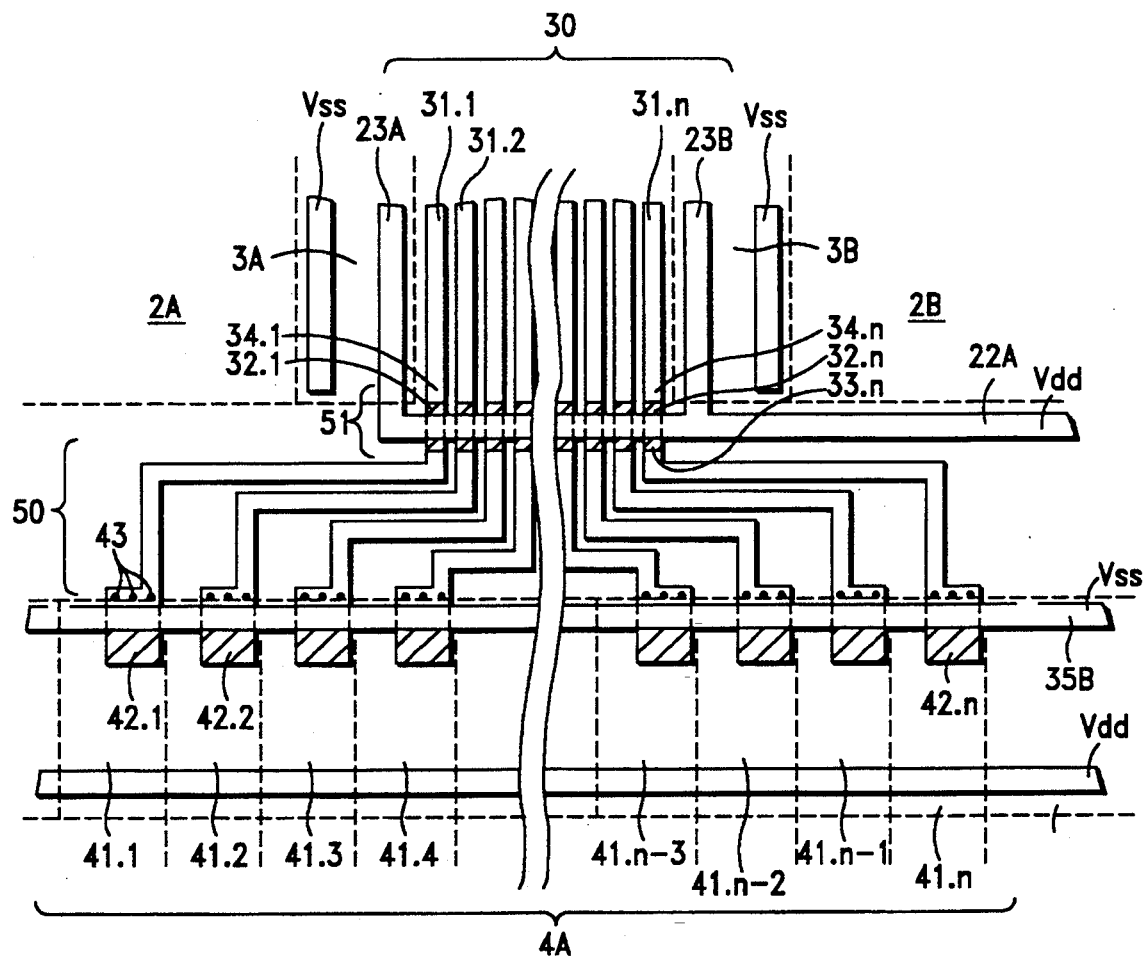
FIG. 5 is a layout diagram showing a conventional portion where signal wirings are assembled in a common bus.

FIG. 3 shows details of region II where signal wirings 31.1 to 31.n are assembled in common bus 30. The layout of signal wirings 31.1 to 31.n, common bus 30, row decoder circuits 3a and 3b, function cells 41.1 to 41.n, jumpers 42.1 to 42.n and power supply wirings 23a and 23b is similar to that of above-described embodiment 1. Hence, the same numerals are assigned and description thereof will be omitted.

In the present embodiment, the point to be noticed is that main wiring 22a from which power supply wirings 23a and 23b are branched is used also as a power supply wiring to peripheral circuit 4a. When peripheral circuit 4a consists of a predecoder and the like and does not include a circuit having large power consumption such as a buffer circuit, potential deflection in the power supply wiring is small, and main wiring 22a may be used in common as a power supply of a decoder circuit. In such a device, it is possible to use power supply wiring 22 and main wiring 22a of the decoder circuit as one power supply wiring by inverting the layout of power supply wiring 12 of Vss and power supply wiring 22 of Vdd of the peripheral circuit in the embodiment 1.

In the layout of the present embodiment, it is only required that jumpers 42.1 to 42.n formed under power supply wiring 22a have the length which makes it possible to exchange interference with one line's portion of the wiring, thereby enabling it to reduce the resistance of signal wirings 31.1 to 31.n. Further, since it is also possible to reduce the quantity of power supply wirings, it is possible to aim at simplification of the layout.

As described above, the problems related to interference among the common bus and power supply wirings which have caused problems in points of reliability and obtaining high access speed of the common bus arranged with a plurality of wirings which increase as the memory capacity and the like increase are solved by arranging the main power supply wiring branched to the bus line in the vicinity of the processing circuit of the signal wirings arranged in the common bus. Accordingly, the layout adopted to solve above-described problems may be called not a complicated layout, but rather a simplified layout in such a point that reduction of jumpers is aimed at as compared with a layout of a conventional semiconductor integrated circuit. It is a matter of course that the manufacturing process will never become more complicated than a conventional semiconductor integrated circuit.

Although, poly-Si is used as an interconnect material in above-described embodiments, it is clear that aluminum wirings may be used.

The layout of power supply wirings is applicable to a memory chip such as a ROM and a RAM. Of course, the layout may be adopted not only in a memory chip, but also in a chip having memory cells. The present invention may also be applicable to chips in which the layout combines wirings of a common bus system with signal processing circuits is used.

While the invention has been described in conjunction with several specific embodiments, it is evident to those skilled in the art that many further alternatives, modifications and variations will be apparent in light of the forgoing description. Thus, the invention described herein is intended to embrace all such alternatives, modifications, applications and variations as may fall within the spirit and scope of the subjoinded claims.

What is claimed is:

1. An integrated circuit (IC) comprising:
   a) a plurality of memory blocks, formed in interior portions of said IC, each said memory block comprising a plurality of memory cells;
   b) a plurality of signal processing circuits, coupled by a corresponding plurality of conductive pathways to said memory blocks, formed in peripheral regions of said IC, said signal processing circuits having an area allocated for jumper formation;
   c) a first routing channel formed between said memory blocks and said signal processing circuits;
   d) a plurality of power supply buses oriented parallel to said first routing channel, and formed in a first conductive layer; and
   e) at least one second routing channel formed between at least one pair of memory blocks, said second routing channel orthogonal to said first routing channel;
   wherein at least two of said power supply buses are formed super adjacent said signal processing circuits, and
   wherein said conductive pathways comprise a first conductive segment formed in said first conductive layer, a second conductive segment, coupled to said first conductive segment by a contact structure, formed in a second conductive layer, said first conductive layer having a first sheet resistance and said second conductive layer having a second sheet resistance, said second sheet resistance being greater than or equal to said first sheet resistance, and said first conductive segment is orthogonal to said power supply buses, said second conductive segment is orthogonal to and disposed under at least two of said power supply buses, and said first conductive segment has at least a first portion, disposed in said first routing channel, that is parallel to said power buses, and a second portion, disposed in said second routing channel, that is orthogonal to said power buses.

2. The integrated circuit of claim 1 wherein said first conductive layer comprises aluminum.

3. The integrated circuit of claim 1 wherein said second conductive layer comprises a material selected from the group consisting of aluminum and polysilicon.

4. The integrated circuit of claim 1 further comprising at least one row decoder coupled to at least one of said memory blocks.

5. The integrated circuit of claim 1 further comprising a main power supply wiring that is orthogonal to said power supply buses.

6. An integrated circuit (IC) comprising:
   a) a plurality of memory blocks, formed in interior portions of said IC, each said memory block comprising a plurality of memory cells;
   b) a plurality of signal processing circuits, coupled by a corresponding plurality of conductive pathways to said memory blocks, formed in peripheral regions of said IC, said signal processing circuits having an area allocated for jumper formation;
   c) a first routing channel formed between said memory blocks and said signal processing circuits;
   d) a plurality of power supply buses, first portions of said plurality of power supply buses are oriented parallel to said first routing channel and formed in a first conductive layer; and
   e) at least one second routing channel formed between at least one pair of memory blocks, said second routing channel orthogonal to said first routing channel;
   wherein second portions of at least two of said power supply buses are arranged in said second routing channel and at least one of said conductive pathways is arranged between said second portions of said at least two power supply buses, and
   wherein said conductive pathways comprise a first conductive segment formed in said first conductive layer, a second conductive segment, coupled to said first conductive segment by a contact structure, formed in a second conductive layer, said first conductive layer having a first sheet resistance and said second conductive layer having a second sheet resistance, said second sheet resistance being greater than or equal to said first sheet resistance, and said first conductive segment is orthogonal to said first portions of said power supply buses, said second conductive segment is orthogonal to said first portions of said power supply buses, and said first conductive segment has at least a first portion, disposed in said first routing channel, that is parallel to said first portions of said power buses, and a second portion, disposed in said second routing channel, that is orthogonal to said first portions of said power buses, and wherein said at least two of said power supply buses are coupled to one another and cross said at least one pathway only in an area disposed over said second conductive segment.

* * * * *